US010209735B1

(12) United States Patent
Lin (10) Patent No.: US 10,209,735 B1
(45) Date of Patent: Feb. 19, 2019

(54) HIGH-SPEED QUADRATURE CLOCK GENERATOR AND METHOD THEREOF (71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/987,955

(22) Filed: May 24, 2018

(51) Int. Cl.
| G06F 1/06 | (2006.01) |
| H03K 5/15 | (2006.01) |
| G06F 1/10 | (2006.01) |
| H03K 5/00 | (2006.01) |

(52) U.S. Cl.
CPC ............... *G06F 1/06* (2013.01); *G06F 1/10* (2013.01); *H03K 5/15013* (2013.01); *H03K 2005/00286* (2013.01)

(58) Field of Classification Search
None
See application file for complete search history.

(56) References Cited

U.S. PATENT DOCUMENTS

| 5,133,064 | A | * | 7/1992 | Hotta | G06F 1/10 |
| | | | | | 327/156 |
| 5,469,116 | A | * | 11/1995 | Slemmer | H03B 5/364 |
| | | | | | 326/93 |
| 7,088,146 | B1 | * | 8/2006 | Megaw | H03K 3/356104 |
| | | | | | 327/563 |
| 2003/0006812 | A1 | * | 1/2003 | Collier | H03K 23/542 |
| | | | | | 327/115 |
| 2012/0007638 | A1 | * | 1/2012 | Meng | H03K 23/50 |
| | | | | | 327/115 |
| 2014/0112053 | A1 | * | 4/2014 | Youn | G11C 13/0069 |
| | | | | | 365/148 |
| 2017/0244393 | A1 | * | 8/2017 | Bagger | H03K 3/356139 |

* cited by examiner

*Primary Examiner* — Cassandra Cox
(74) *Attorney, Agent, or Firm* — McClure, Qualey & Rodack, LLP (57) ABSTRACT

An apparatus is configured to receive a two-phase input clock and output a four-phase output clock, the apparatus includes a first data latch and a second data latch configured in a ring topology with a negative feedback based on inter-connection through a four-phase level-shifted clock, the first data latch configured to receive a fourth phase and a second phase of the level-shifted clock and output a first phase and a third phase of the output clock along with a first phase and a third phase of the level-shifted clock in accordance with a first phase of the input clock, the second data latch configured to receive the first phase and the third phase of the level-shifted clock and output a second phase and a fourth phase of the output clock along with the second phase and the fourth phase of the level-shifted clock in accordance with a second phase of the input clock.

16 Claims, 12 Drawing Sheets

FIG. 7

HIGH-SPEED QUADRATURE CLOCK GENERATOR AND METHOD THEREOF

BACKGROUND OF THE DISCLOSURE

Field of the Disclosure

The present disclosure generally relates to quadrature clock generation, and more particularly to quadrature clock generation circuits and methods.

Description of Related Art

Figure 1A:
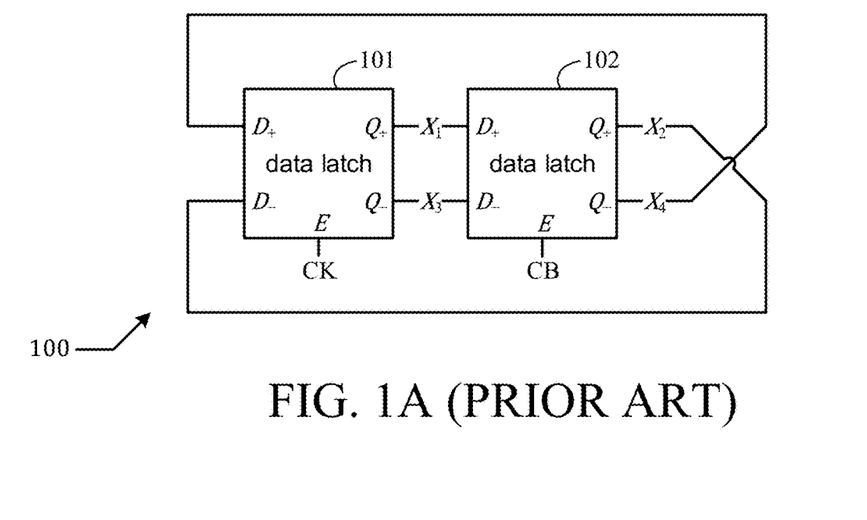
FIG. 1A shows a schematic diagram of a prior art quadrature clock generator.
Figure 1B:
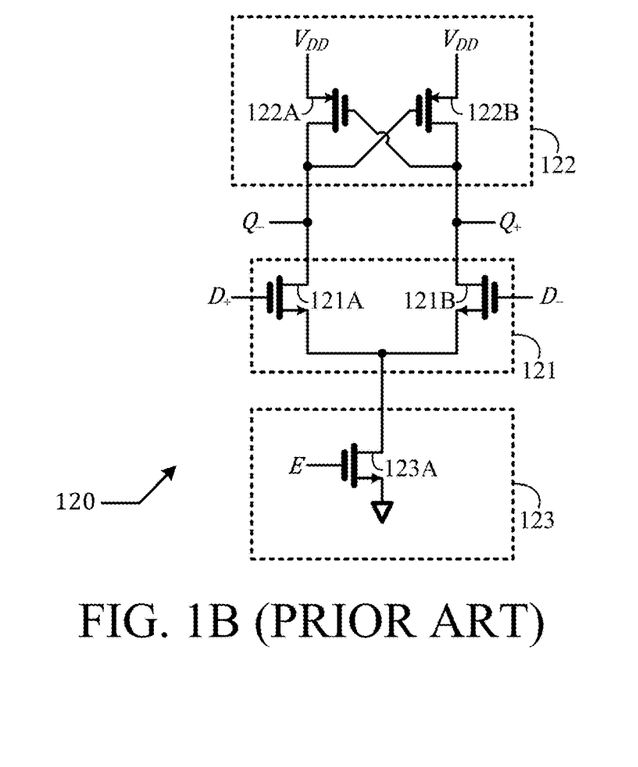
FIG. 1B shows a schematic diagram of a data latch.

Quadrature clocks are widely used in radio transceivers. A schematic diagram of a prior art quadrature clock generator 100 is depicted in FIG. 1A. Quadrature clock generator 100 is configured to receive a two-phase input clock comprising a first phase CK and a second phase CB and output a four-phase output clock comprising a first phase $X_1$, a second phase $X_2$, a third phase $X_3$, and a fourth phase $X_4$. Quadrature clock generator 100 comprises a first data latch 101 and a second data latch 102 configured in a ring topology with a negative feedback, wherein each of the two data latches has two input pins labeled by "$D_+$," and "$D_-$," two output pins labeled by "$Q_+$" and "$Q_-$," and an enabling pin labeled by "E." The first (second) data latch 101 (102) receives $X_4$ ($X_1$) and $X_2$ ($X_3$) via its two input pins "$D_+$" and "$D_-$," respectively, outputs $X_1$ ($X_2$) and $X_3$ ($X_4$) via its two output pin pins "$Q_+$" and "$Q_-$," respectively, and works in accordance with CK (CB) via its "E" pin. A schematic diagram of a data latch 120 that can be instantiated to embody the two data latches 101 and 102 is shown in FIG. 1B.

Data latch 120 comprises a differential pair 121, a cross-coupling pair 122, and a switch 123. Throughout this disclosure, "$V_{DD}$" denotes a supply voltage. The differential pair 121 comprises a first NMOS (n-channel metal oxide semiconductor) transistor 121A and a second NMOS transistor 121B configured to receive a differential input signal received from the two input pins "$D_+$" and "$D_-$," and output a differential output signal to the two output pins "$Q_+$" and "$Q_-$."

The cross-coupling pair 122 comprises a first PMOS (p-channel metal oxide semiconductor) transistor 122A and a second PMOS transistor 122B, wherein PMOS transistor 122A is configured to receive the voltage at pin "$Q_+$" via its gate and regenerate the voltage at pin $Q_-$" via its drain, while PMOS transistor 122B is configured to receive the voltage at pin "$Q_-$" via its gate and regenerate the voltage at pin "$Q_+$" via its drain. The switch 123 comprises a third NMOS transistor 123A, controlled by a control signal received from the enabling pin "E" and configured to provide a discharge path for the differential pair 121 when enabled. When the control signal received from the enabling pin "E" is high (low), the switch 123 is switched on (off) to allow (disallow) the differential pair 121 to update a state of the cross-coupling pair 122; as such, the data latch is in an active (a frozen) state and the state of the cross-coupling pair 122 is updated (latched).

Figure 1C:
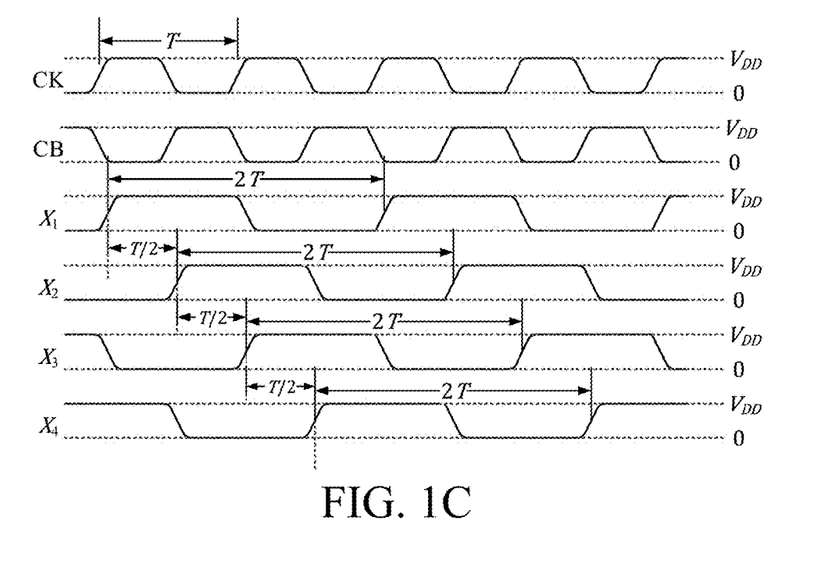
FIG. 1C shows an exemplary timing diagram of the prior art quadrature clock generator of FIG. 1A.

An exemplary timing diagram of quadrature clock generator 100 is shown in FIG. 1C. Here, T is a period of CK and CB. As shown, $X_1$, $X_2$, $X_3$, and $X_4$ all have a period of 2T, $X_2$ trails $X_1$ by T/2, $X_3$ trails $X_2$ by T/2, and $X_4$ trails $X_3$ by T/2. This way, a quadrature clock is generated, wherein four phases are uniformly displaced in time with 90 degrees (which is one quarter of the clock period) apart between two adjacent phases.

There is a fundamental issue with the prior art quadrature clock generator 100. The outputs of the first data latch 101 are the inputs of the second data latch 102, and vice versa. The input devices (i.e. the two NMOS transistors 121A and 121B in FIG. 1B) and the output devices (i.e. the two PMOS transistors 122A and 122B), however, are of opposite types. The input devices favor a higher crossover point for easier turn-on, while the output devices favor a lower crossover point for easier turn-on. If we make our design favorable to the output devices for the first data latch 101, the design become unfavorable to the input devices of the second data latch 102, and vice versa, since the outputs of one data latch are the inputs of the other data latch, and the input devices and the output devices are of opposite types.

What is desired is a method and circuit that overcome the fundamental dilemma of favoring input devices or output devices.

SUMMARY OF THE DISCLOSURE

In an embodiment, an apparatus is configured to receive a two-phase input clock and output a four-phase output clock, the apparatus comprising a first data latch and a second data latch configured in a ring topology with a negative feedback based on inter-connection through a four-phase level-shifted clock, the first data latch configured to receive a fourth phase and a second phase of the level-shifted clock and output a first phase and a third phase of the output clock along with a first phase and a third phase of the level-shifted clock in accordance with a first phase of the input clock, the second data latch configured to receive the first phase and the third phase of the level-shifted clock and output a second phase and a fourth phase of the output clock along with the second phase and the fourth phase of the level-shifted clock in accordance with a second phase of the input clock.

In an embodiment, a method comprises: receiving a two-phase input clock; incorporating a first data latch configured to receive a fourth phase and a second phase of a four-phase level-shifted clock and output a first phase and a third phase of a four-phase output clock along with a first phase and a third phase of the four-phase level-shifted clock in accordance with a first phase of the two-phase input clock; and incorporating a second data latch configured to receive the first phase and the third phase of the four-phase level-shifted clock and output a second phase and a fourth phase of the four-phase output clock along with the second phase and the fourth phase of the four-phase level-shifted clock in accordance with a second phase of the two-phase input clock.

DETAILED DESCRIPTION OF THIS DISCLOSURE

The present disclosure is directed to quadrature clock generation. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "power node," "ground node," "inverter," "voltage," "CMOS (complementary metal oxide semiconductor)," "PMOS (P-channel metal oxide semiconductor) transistor," "NMOS (N-channel metal oxide semiconductor) transistor," "resistor," "capacitor," "phase," "clock," "signal," "load," "cascode," "gain," "common-source," "bias," "self-bias", "AC (alternating current)," "DC (direct current)," "cross-coupling," "regenerative load," "latch," "differential signal," "differential pair," and "switch." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof, and understand meanings of units such as "KOhm (kilo-Ohm)," "fF (femto-Farad)," "nm (nanometer)," and "μm (micron)" without the need of explanations.

This disclosure is presented in an engineering sense, instead of a rigorous mathematical sense. For instance, "A is equal to B" means "a difference between A and B is smaller than an engineering tolerance.

Throughout this disclosure, a ground node is used as a reference node of zero voltage (0V) electrical potential. A power node is denoted by "$V_{DD}$." A clock is a voltage signal that cyclically toggles back and forth between a low level (e.g. 0V) and a high level (e.g., the electrical potential at the power supply node "$V_{DD}$," or $V_{DD}$ for short). By way of example but not limitation, a 28 nm CMOS (complementary metal oxide semiconductor) process is used for fabrication, and "$V_{DD}$" is equal to 1.05V throughout this disclosure.

Figure 2A:
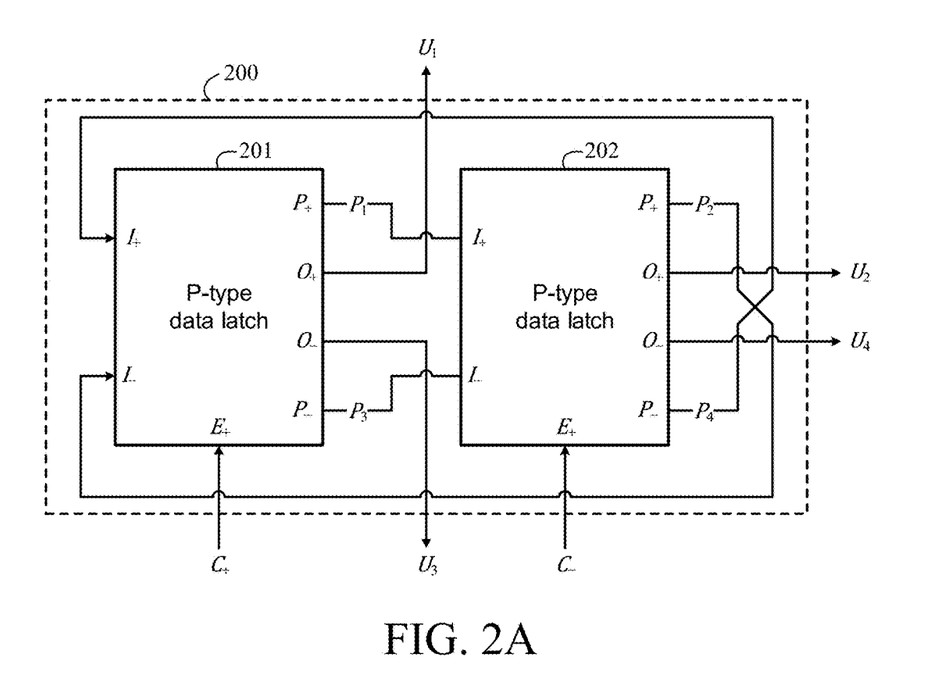
FIG. 2A shows a schematic diagram of a quadrature clock generator in accordance with a first embodiment of the present disclosure.
Figure 2B:
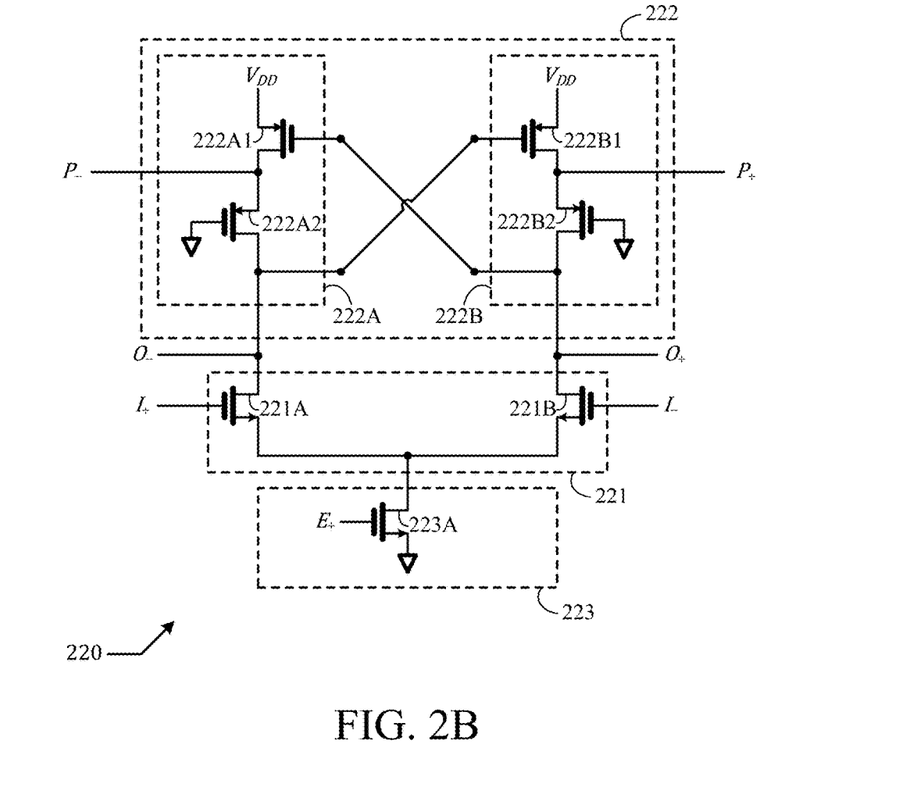
FIG. 2B shows a schematic diagram of a P-type data latch.

A schematic diagram of a quadrature clock generator 200 in accordance with a first embodiment of the present disclosure is depicted in FIG. 2A. Quadrature clock generator 200 is configured to receive a two-phase input clock comprising a first phase $C_+$ and a second phase $C_-$ and output a four-phase output clock comprising a first phase $U_1$, a second phase $U_2$, a third phase $U_3$, and a fourth phase $U_4$. A four-phase level-shifted clock comprising a first phase $P_1$, a second phase $P_2$, a third phase $P_3$, and a fourth phase $P_4$ are also generated for inter-connection purpose. Quadrature clock generator 200 comprises a first P-type data latch 201 and a second P-type data latch 202 configured in a ring topology with a negative feedback, wherein each of the two P-type data latches has two input pins labeled by "$I_+$" and "$I_-$," two output pins labeled by "$O_+$" and "$O_-$," two level-shifted output pins labeled by "$P_+$," and "$P_-$," and an active-high enabling pin labeled by "$E_+$." The first (second) P-type data latch 201 (202) receives $C_+$ ($C_-$) via its active-high enabling pin "$E_+$" and also $P_4$ ($P_1$) and $P_2$ ($P_3$) via its two input pins "$I_+$" and "$I_-$," respectively, outputs $U_1$ ($U_2$) and $U_3$ ($U_4$) via its two output pin pins "$O_+$" and "$O_-$," respectively, and also outputs $P_1$ ($P_2$) and $P_3$ ($P_4$) via its two level-shifted output pin pins "$P_+$" and "$P_-$," respectively. A schematic diagram of a P-type data latch 220 that can be instantiated to embody the two P-type data latches 201 and 202 is shown in FIG. 2B. P-type data latch 220 comprises a differential pair 221, a cross-coupling cascode pair 222, and a switch 223. The differential pair 221 comprises a first NMOS (n-channel metal oxide semiconductor) transistor 221A and a second NMOS transistor 221B configured to receive a differential input signal received from the two input pins "$I_+$" and "$I_-$," and output a differential output signal to the two output pins "$O_+$" and "$O_-$." The cross-coupling cascode pair 222 comprises a first cascode amplifier 222A and a second cascode amplifier 222B configured in a cross-coupling topology to serve as a regenerative load to the differential pair 221, wherein the first cascode amplifier 222A receives the voltage at pin "$O_+$" and regenerates the voltage at pin "$O_-$," while the second cascode amplifier 222B receives the voltage at pin "$O_-$" and regenerates the voltage at pin "$O_+$." The first (second) cascode amplifier 222A (222B) comprises a first (third) PMOS transistor 222A1 (222B1) configured to receive input from pin "$O_+$" ("$O_-$") and a second (fourth) PMOS transistor 222A2 (222B2) configured to deliver a regenerative output to pin "$O_-$" ("$O_+$"). PMOS transistors 222A1 and 222B1 functions as a common-source gain device while PMOS transistors 222A2 and 222B2 function as a cascode device. The two level-shifted output pins "$P_-$" and "$P_+$" connect to the source of PMOS transistor 222A2 and the source of PMOS transistor 222B2, respectively. Due to using the two cascode devices (i.e. PMOS transistors 222A2 and 222B2), the voltages at the two level-shifted output pins "$P_-$" and "$P_+$" will be higher than the voltages at the two output pins "$O_-$" and "$O_+$," and thus have a higher crossover point; this applies to both P-type data latches 201 and 202. The level-shifted outputs of the first P-type data latch 201 are the inputs of the second P-type data latch 202, and vice versa. This is favorable to the input devices (i.e. NMOS transistors 221A and 221B) because the inputs can have a higher crossover point. On the other hand, the outputs are taken from the drains of the cascode devices (i.e. PMOS transistors 222A2 and 222B2) and have a lower crossover point. This is favorable to the output devices (i.e. cascode amplifiers 222A and 222B) because the outputs can have a lower crossover point. This resolves the fundamental dilemma of favoring input devices or output devices in prior art quadrature clock generator 100.

By way of example but not limitation, in an embodiment, the W/L (which stands for width/length) of NMOS transistors 221A, 221B, 223A are 2.4 μm/30 nm, 2.4 μm/30 nm, and 7.2 μm/30 nm, respectively; the W/L of PMOS transistors 222A1 and 222B1 are both 3.12 μm/30 nm; and the W/L of PMOS transistors 222A2 and 222B2 are both 1.56 μm/30 nm.

Figure 3A:
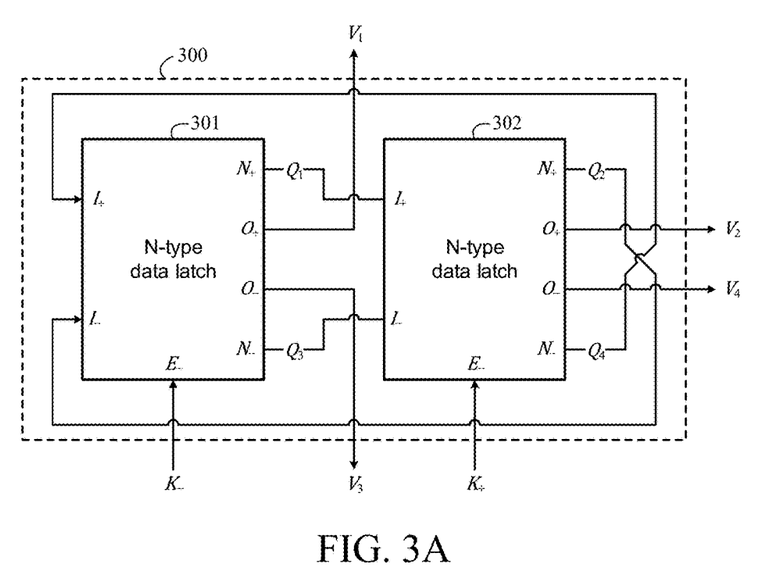
FIG. 3A shows a schematic diagram of a quadrature clock generator in accordance with a second embodiment of the present disclosure.

A schematic diagram of a quadrature clock generator 300 in accordance with a second embodiment of the present disclosure is depicted in FIG. 3A. Quadrature clock generator 300 is configured to receive a two-phase input clock comprising a first phase $K_+$ and a second phase $K_-$ and output a four-phase output clock comprising a first phase $V_1$, a second phase $V_2$, a third phase $V_3$, and a fourth phase $V_4$. A four-phase level-shifted clock comprising a first phase $Q_1$, a second phase $Q_2$, a third phase $Q_3$, and a fourth phase $Q_4$ are also generated for inter-connection purpose. Quadrature clock generator 300 comprises a first N-type data latch 301 and a second N-type data latch 302 configured in a ring topology with a negative feedback, wherein each of the two N-type latches has two input pins labeled by "$I_+$" and "$I_-$," two output pins labeled by "$O_+$" and "$O_-$," two level-shifted output pins labeled by "$N_+$" and "$N_-$," and an active-low enabling pin labeled by "$E_-$." The first (second) N-type data latch 301 (302) receives $K_-$ ($K_+$) via its active-low enabling pin "$E_-$" and also $Q_4$ ($Q_1$) and $Q_2$ ($Q_3$) via its two input pins "$I_+$" and "$I_-$," respectively, outputs $V_1$ ($V_2$) and $V_3$ ($V_4$) via its two output pin pins "$O_+$" and "$O_-$," respectively, and also outputs $Q_1$ ($Q_2$) and $Q_3$ ($Q_4$) via its two level-shifted output pin pins "$N_+$" and "$N_-$," respectively.

Figure 3B:
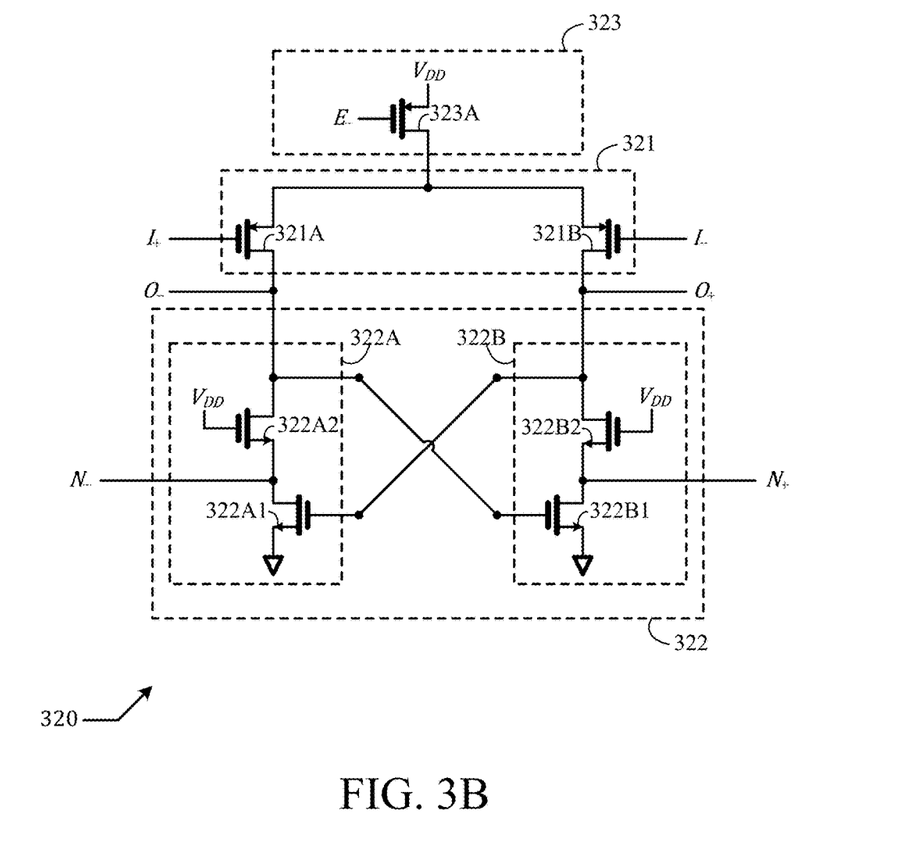
FIG. 3B shows a schematic diagram of a N-type data latch.

A schematic diagram of a N-type data latch 320 that can be instantiated to embody the two N-type data latches 301 and 302 is shown in FIG. 3B. N-type data latch 320 comprises a differential pair 321, a cross-coupling cascode pair 322, and a switch 323. The differential pair 321 comprises a first PMOS (n-channel metal oxide semiconductor) transistor 321A and a second PMOS transistor 321B configured to receive a differential input signal received from the two input pins "$I_+$" and "$I_-$," and output a differential output signal to the two output pins "$O_+$" and "$O_-$." The cross-coupling cascode pair 322 comprises a first cascode amplifier 322A and a second cascode amplifier 322B configured in a cross-coupling topology to serve as a regenerative load to the differential pair 321, wherein the first cascode amplifier 322A receives the voltage at pin "$O_+$" and regenerates the voltage at pin "$O_-$," while the second cascode amplifier 322B receives the voltage at pin "$O_-$" and regenerates the voltage at pin "$O_+$."

The first (second) cascode amplifier 322A (322B) comprises a first (third) NMOS transistor 322A1 (322B1) configured to receive input from pin "$O_+$" ("$O_-$") and a second (fourth) NMOS transistor 322A2 (322B2) configured to deliver a regenerative output to pin "$O_-$" ("$O_+$"). NMOS transistors 322A1 and 322B1 function as a common-source gain device while NMOS transistors 322A2 and 322B2 function as a cascode device. The two level-shifted output pins "$N_-$" and "$N_+$" connect to the source of NMOS transistor 322A2 and the source of NMOS transistor 322B2, respectively. Because two cascode devices (i.e. NMOS transistors 322A2 and 322B2) are used, the voltages at the two level-shifted output pins "$N_-$" and "$N_+$" will be lower than the voltages at the two output pins "$O_-$" and "$O_+$," and thus have a lower crossover point; this applies to both N-type data latches 301 and 302. The level-shifted outputs of the first N-type data latch 301 are the inputs of the second N-type data latch 302, and vice versa. This is favorable to the input devices (i.e. PMOS transistors 221A and 221B) because the inputs can have a higher crossover point. On the other hand, the outputs are taken from the drains of the cascode devices (i.e. NMOS transistors 322A2 and 322B2) and have a higher crossover point. This is favorable to the output devices (i.e. cascode amplifiers 322A and 322B) because the outputs can have a higher crossover point. This resolves the fundamental dilemma of favoring input devices or output devices in prior art quadrature clock generator 100.

The second embodiment shown in FIG. 3A is complementary to the first embodiment shown in FIG. 2A.

By way of example but not limitation, in an embodiment, the W/L (which stands for width/length) of PMOS transistors 321A, 321B, 323A are 3.12 μm/30 nm, 3.12 μm/30 nm, and 9.36 μm/30 nm, respectively; the W/L of PMOS transistors 222A1 and 222B1 are both 2.4 μm/30 nm; and the W/L of PMOS transistors 222A1 and 222B1 are both 1.2 μm/30 nm.

Figure 4:
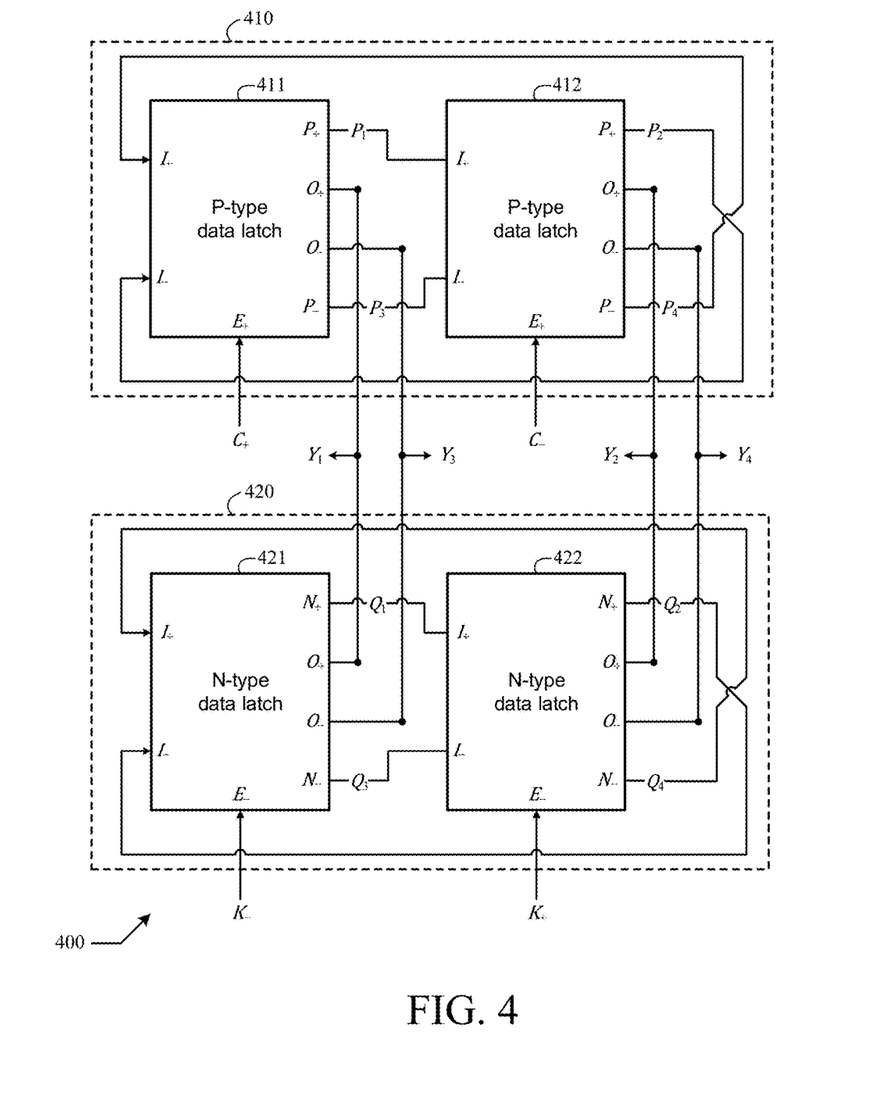
FIG. 4 shows a schematic diagram of a quadrature clock generator in accordance with a third embodiment of the present disclosure.

A schematic diagram of a quadrature clock generator 400 in accordance with a third embodiment of the present disclosure is depicted in FIG. 4. Quadrature clock generator 400 receives a first two-phase input clock (comprising a first phase $C_+$ and a second phase $C_-$) and a second two-phase input clock (comprising a first phase $K_+$ and a second phase $K_-$) and output a four-phase output clock (comprising a first phase $Y_1$, a second phase $Y_2$, a third phase $Y_3$, and a fourth phase $Y_4$). Quadrature clock generator 400 comprises a first half 410 and a second half 420, wherein the first half 410 is identical with quadrature clock generator 200 of FIG. 2A and the second half 420 is identical with quadrature clock generator 300 of FIG. 3A, but the four-phase output clock output from the first half 410 (previously referred to as the four-phase output clock comprising $U_1$, $U_2$, $U_3$, and $U_4$ in quadrature clock generator 200) and the four-phase output clock output from the second half 420 (previously referred to as the four-phase output clock comprising $V_1$, $V_2$, $V_3$, and $V_4$ in quadrature clock generator 300) are here combined and jointly form the four-phase output clock comprising $Y_1$, $Y_2$, $Y_3$, and $Y_4$.

The first half 410 comprises two P-type data latches 411 and 412 configured in a ring topology with a negative feedback, while the second half 420 comprises two N-type data latches 421 and 422 configured in a ring topology with a negative feedback. In an embodiment, the first two-phase input clock (comprising $C_+$ and $C_-$) is the same as the second two-phase input clock (comprising $K_+$ and $K_-$). In an alternative embodiment, the first two-phase input clock (comprising $C_+$ and $C_-$) and the second two-phase input clock (comprising $K_+$ and $K_-$) are derived from a common two-phase clock comprising a first phase $B_+$ and a second phase $B_-$ using a level-shifting circuit 500 depicted in FIG. 5A.

Figure 5A:
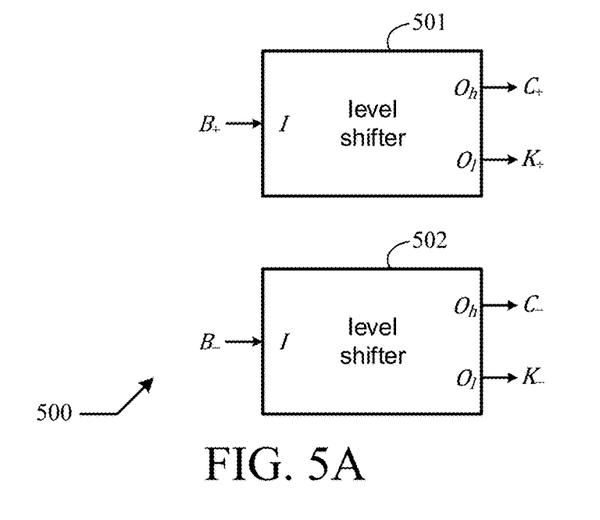
FIG. 5A shows a schematic diagram of a level-shifting circuit.
Figure 5B:
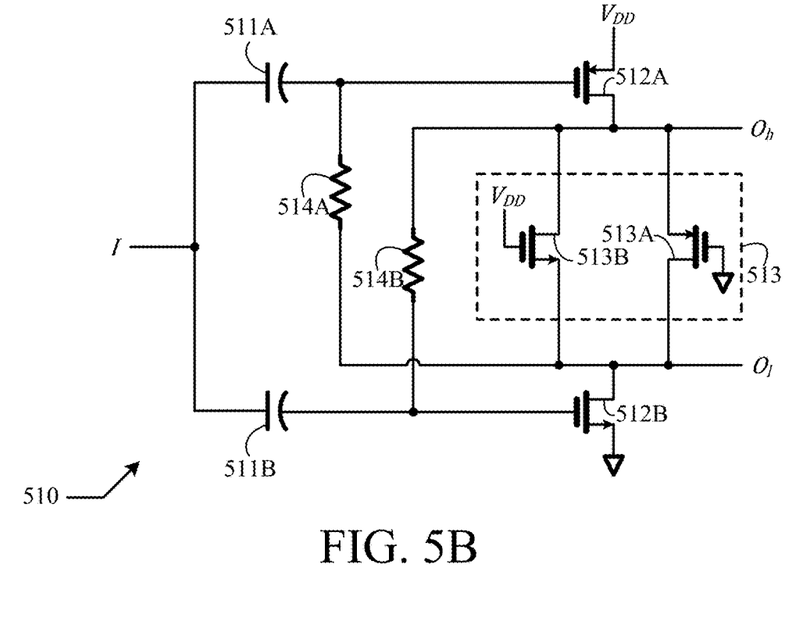
FIG. 5B shows a schematic diagram of a level shifter that can be instantiated by the level-shifting circuit of FIG. 5A.

The level-shifting circuit 500 comprises a first level shifter 501 configured to receive $B_+$ and output $C_+$ and $K_+$, and a second level shifter 502 configured to receive $B_-$ and output $C_-$ and $K_-$. Each of the two level-shifters 501 and 502 has an input pin labeled by "1," a shifted-high output pin labeled by "$O_h$," and a shifted-low output pin labeled by "$O_l$." The first (second) level-shifter 501 (502) receives $B_+$ ($B_-$) via its "1" pin, and outputs $C_+$ ($C_-$) and $K_+$ ($K_-$) via its "$O_h$" pin and "$O_l$" pin, respectively. A schematic diagram of a level-shifter 510 that can be instantiated to embody level-shifters 501 and 502 is depicted in FIG. 5B. Level-shifter 510 comprises a first capacitor 511A, a second capacitor 511B, a first resistor 514A, a second resistor 514B, a third resistor 513, a first PMOS transistor 512A, and a first NMOS transistor 512B.

By way of example but not limitation, the third resistor 513 is embodied by a parallel connection of a second PMOS transistor 513A and a second NMOS transistor 513B. The PMOS transistor 512A and NMOS transistor 512B forms an inverter configured to receive the input from the "1" pin via an AC-coupling scheme, wherein capacitor 511A and capacitor 511B provide an AC coupling from the "1" pin to the gates of PMOS transistor 512A and NMOS transistor 512B, respectively, while resistor 514A and resistor 514B provide a DC bias to the gate of PMOS transistor 512A and the gate of NMOS transistor 512B, respectively, using a self-biasing scheme. Resistor 513 is inserted between the drain of PMOS transistor 512A and the drain of NMOS transistor 512B. Due to resistor 513, the voltage at the drain PMOS transistor 512A will be higher than the voltage at the drain of NMOS transistor 512B. Therefore, the "$O_h$" pin, which connects to the drain of PMOS transistor 512A, can provide a shifted-high output, while the "$O_l$" pin, which connects to the drain of NMOS transistor 512B, can provide a shifted-low output. Besides, PMOS (NMOS) transistor 512A (512B) is biased by a DC voltage at the "$O_l$" ("$O_h$") pin via resistor 514A (514B), a favorable biasing condition can be established since the DC voltage at the $O_l$" ("$O_h$") pin is relatively low (high).

By way of example but not limitation, in an embodiment: capacitors 511A and 511B are both 40 fF; resistors 514A and 514B are both 8.5 KOhm; the W/L (which stands for width/length) of PMOS transistors 512A and 513A are 6.24 µm/30 nm and 3.12 µm/30 nm; respectively; and the W/L of NMOS transistors 512B and 513B are 4.8 µm/30 nm and 2.4 µm/30 nm, respectively.

Figure 6A:
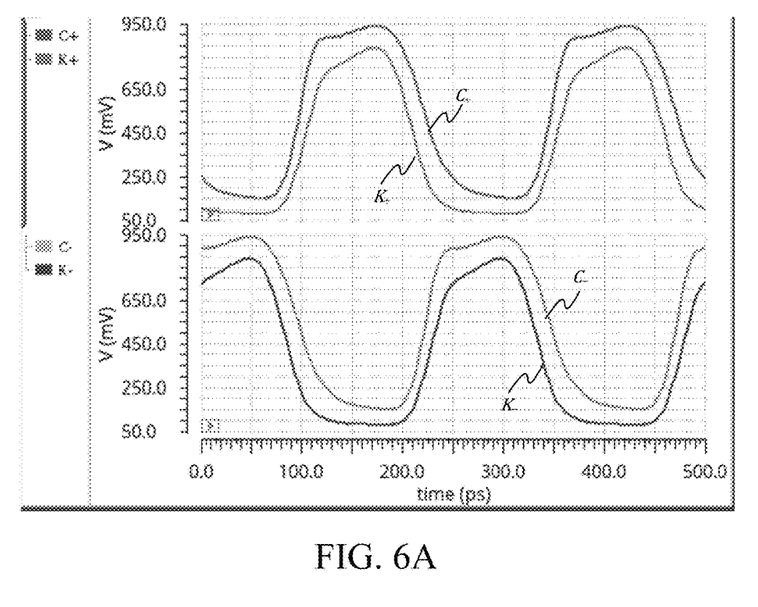
FIG. 6A shows simulated waveforms of a first two-phase input clock and a second two-phase input clock generated by the level-shifting circuit of FIG. 5A.
Figure 6B:
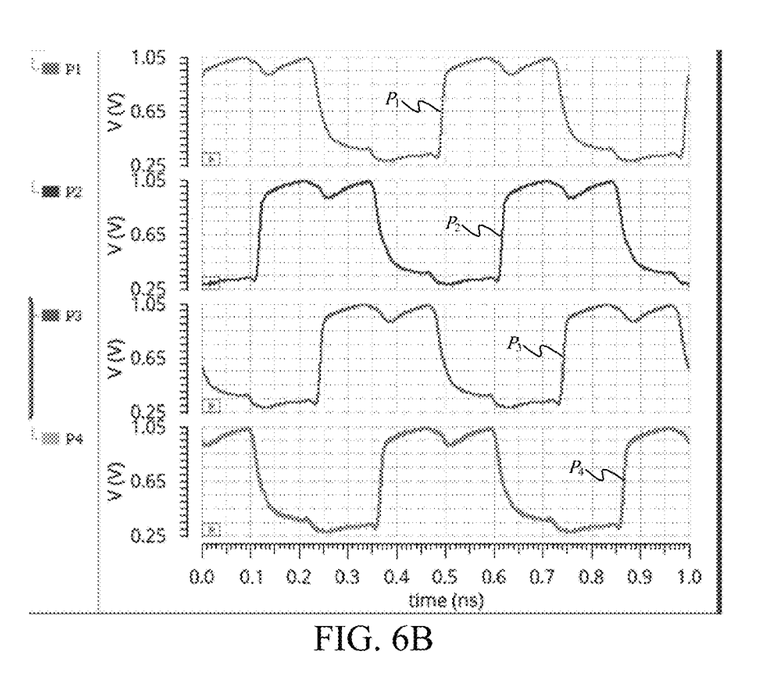
FIG. 6B shows simulated waveforms of a four-phase level-shifted clock within a first half of the quadrature clock generator of FIG. 4.
Figure 6C:
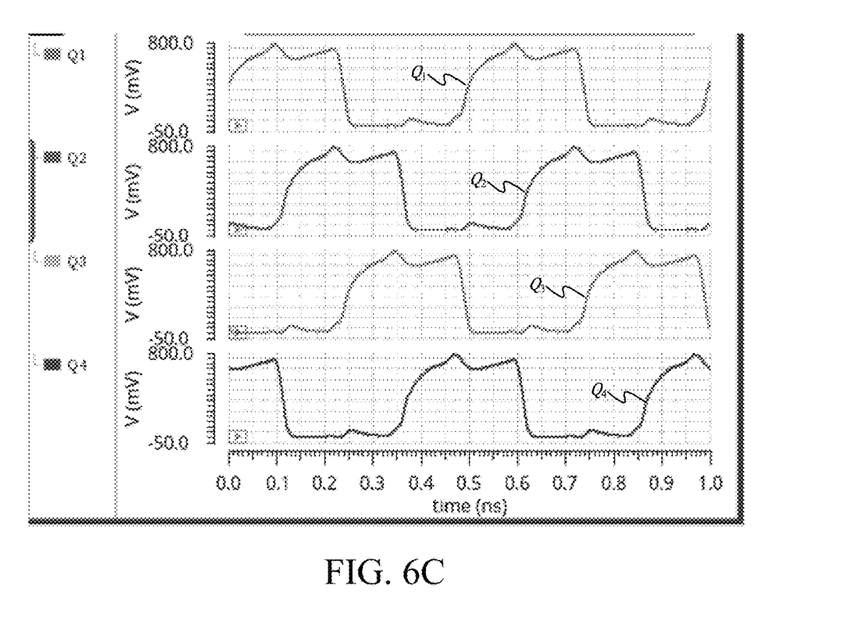
FIG. 6C shows simulated waveforms of a four-phase level-shifted clock within a second half of the quadrature clock generator of FIG. 4.
Figure 6D:
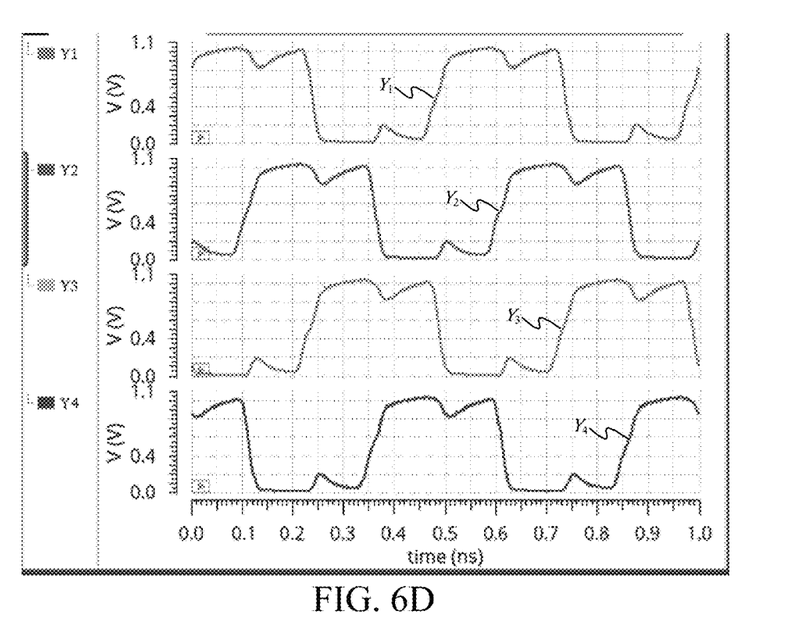
FIG. 6D shows simulated waveforms of a four-phase output clock of the quadrature clock generator of FIG. 4.

A plurality of simulation waveforms of quadrature clock generator 400 are shown in FIG. 6A, FIG. 6B, FIG. 6C, and FIG. 6D. As shown in FIG. 6A, the first two-phase clock (comprising $C_+$ and $C_-$) and the second two-phase clock (comprising $K_+$ and $K_-$) have the same frequency and phase, but the first two-phase clock has a higher level than the second two-phase clock. As shown in FIG. 6B, a level of the four-phase level-shifted clock (comprising $P_1$, $P_2$, $P_3$, and $P_4$) within the first half 410 is approximately between 0.26V and 1.05V, exhibiting the shifted-high characteristics. As shown in FIG. 6C, the four-phase level-shifted clock (comprising $Q_1$, $Q_2$, $Q_3$, and $Q_4$) within the second half 420 is approximately between 0V and 800 mV, exhibiting the shifted-low characteristics. As shown in FIG. 6D, the four-phase output clock (comprising $Y_1$, $Y_2$, $Y_3$, and $Y_4$) has a full-swing between 0V and 1.05V.

Figure 7:
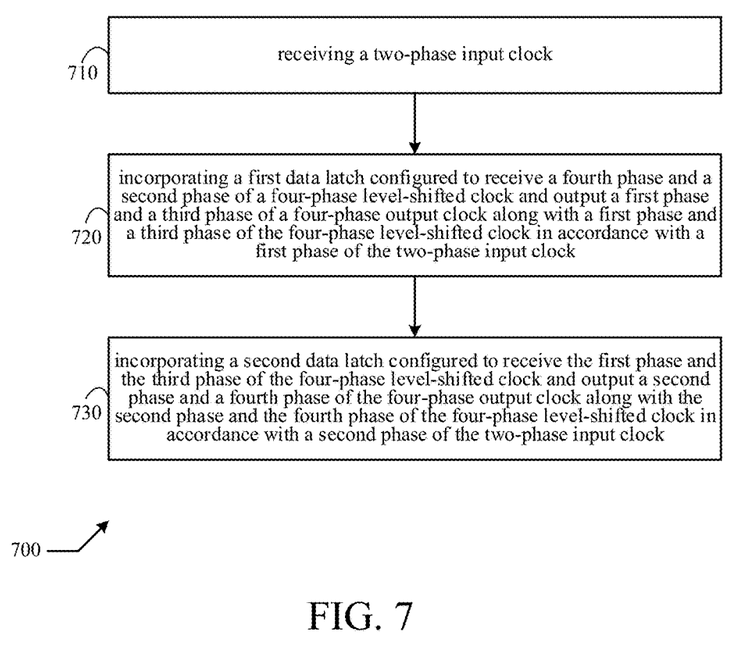
FIG. 7 shows a flow diagram of a method in accordance with an embodiment of the present invention.

As shown in a flow diagram 700 depicted in FIG. 7, a method in accordance with an embodiment of the present disclosure comprises: (step 710 of) receiving a two-phase input clock; (step 720 of) incorporating a first data latch configured to receive a fourth phase and a second phase of a four-phase level-shifted clock and output a first phase and a third phase of a four-phase output clock along with a first phase and a third phase of the four-phase level-shifted clock in accordance with a first phase of the two-phase input clock; and (step 720 of) incorporating a second data latch configured to receive the first phase and the third phase of the four-phase level-shifted clock and output a second phase and a fourth phase of the four-phase output clock along with the second phase and the fourth phase of the four-phase level-shifted clock in accordance with a second phase of the two-phase input clock.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An apparatus configured to receive a two-phase input clock and output a four-phase output clock, the apparatus comprising:
a first data latch and a second data latch configured in a ring topology with a negative feedback based on interconnection through a four-phase level-shifted clock, the first data latch configured to receive a fourth phase and a second phase of the level-shifted clock and output a first phase and a third phase of the output clock along with a first phase and a third phase of the level-shifted clock in accordance with a first phase of the input clock, the second data latch configured to receive the first phase and the third phase of the level-shifted clock and output a second phase and a fourth phase of the output clock along with the second phase and the fourth phase of the level-shifted clock in accordance with a second phase of the input clock.

2. The apparatus of claim 1, wherein the first data latch and the second data latch are instantiated from a building block comprising: a differential pair configured to receive a differential input signal via two input pins and output a differential signal via two output pins; a cross-coupling cascode pair configured to serve as a regenerative load to the differential pair and output a differential level-shifted signal via two level-shifted output pins; and a switch controlled by an enabling signal received via an enabling pin configured to conditionally enable the differential pair in accordance the enabling signal.

3. The apparatus of claim 2, wherein: the first phase and the third phase of the output clock are output from the two output pins of the first data latch; the first phase and the third phase of the level-shifted clock are output from the two level-shifted output pins of the first data latch; the second phase and the fourth phase of the output clock are output from the two output pins of the second data latch; the second phase and the fourth phase of the four-phase level-shifted clock are output from the two level-shifted output pins of the second data latch; the first data latch receives the fourth phase and the second phase of the level-shifted clock via its two input pins and receives the first phase of the input clock via its enabling pin; and the second data latch receives the first phase and the third phase of the level-shifted clock via its two input pins and receives the second phase of the input clock via its enabling pin.

4. The apparatus of claim 2, wherein the cross-coupling cascode pair comprises a first cascode amplifier and a second cascode amplifier, the first cascode amplifier comprising a first gain device and a first cascode device, the second cascode amplifier comprising a second gain device and a second cascode device.

5. The apparatus of claim 4, wherein the differential level-shifted signal is tapped from a source of the first cascode device and a source of the second cascode device.

6. The apparatus of claim 2, wherein the differential pair and the switch are constructed by MOS (metal oxide semiconductor) devices of a first type, while the cross-coupling cascode pair are constructed by MOS devices of a second type.

7. The apparatus of claim 6, wherein the MOS devices of the first type are NMOS (n-channel metal oxide semiconductor) transistors, while the MOS devices of the second type are PMOS (p-channel metal oxide semiconductor) transistors.

8. The apparatus of claim 6, wherein the MOS devices of the first type are PMOS (p-channel metal oxide semiconductor) transistors, while the MOS devices of the second type are NMOS (n-channel metal oxide semiconductor) transistors.

9. A method comprising:
incorporating a first data latch configured to receive a fourth phase and a second phase of a four-phase level-shifted clock and output a first phase and a third phase of a four-phase output clock along with a first phase and a third phase of the four-phase level-shifted clock in accordance with a first phase of the two-phase input clock; and
incorporating a second data latch configured to receive the first phase and the third phase of the four-phase level-shifted clock and output a second phase and a fourth phase of the four-phase output clock along with the second phase and the fourth phase of the four-phase level-shifted clock in accordance with a second phase of the two-phase input clock.

10. The method of claim 9, wherein the first data latch and the second data latch are instantiated from a building block comprising: a differential pair configured to receive a differential input signal via two input pins and output a differential signal via two output pins; a cross-coupling cascode pair configured to serve as a regenerative load to the differential pair and output a differential level-shifted signal via two level-shifted output pins; and a switch controlled by an enabling signal received via an enabling pin configured to conditionally enable the differential pair in accordance the enabling signal.

11. The method of claim 10, wherein: the first phase and the third phase of the output clock are output from the two output pins of the first data latch; the first phase and the third phase of the level-shifted clock are output from the two level-shifted output pins of the first data latch; the second phase and the fourth phase of the output clock are output from the two output pins of the second data latch; the second phase and the fourth phase of the four-phase level-shifted clock are output from the two level-shifted output pins of the second data latch; the first data latch receives the fourth phase and the second phase of the level-shifted clock via its two input pins and receives the first phase of the input clock via its enabling pin; and the second data latch receives the first phase and the third phase of the level-shifted clock via its two input pins and receives the second phase of the input clock via its enabling pin.

12. The method of claim 10, wherein the cross-coupling cascode pair comprises a first cascode amplifier and a second cascode amplifier, the first cascode amplifier comprising a first gain device and a first cascode device, the second cascode amplifier comprising a second gain device and a second cascode device.

13. The method of claim 12, wherein the differential level-shifted signal is tapped from a source of the first cascode device and the source of a second cascode device.

14. The method of claim 10, wherein the differential pair and the switch are constructed by MOS (metal oxide semiconductor) devices of a first type, while the cross-coupling cascode pair are constructed by MOS devices of a second type.

15. The method of claim 14, wherein the MOS devices of the first type are NMOS (n-channel metal oxide semiconductor) transistors, while the MOS devices of the second type are PMOS (p-channel metal oxide semiconductor) transistors.

16. The method of claim 14, wherein the MOS devices of the first type are PMOS (p-channel metal oxide semiconductor) transistors, while the MOS devices of the second type are NMOS (n-channel metal oxide semiconductor) transistors.

* * * * *